United States Patent
Pandey et al.

(10) Patent No.: US 10,353,298 B2
(45) Date of Patent: Jul. 16, 2019

(54) METHOD OF MEASURING A TARGET, METROLOGY APPARATUS, POLARIZER ASSEMBLY

(71) Applicant: ASML Netherlands B.V., Veldhoven (NL)

(72) Inventors: Nitesh Pandey, Eindhoven (NL); Zili Zhou, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/830,775

(22) Filed: Dec. 4, 2017

(65) Prior Publication Data

US 2018/0157180 A1    Jun. 7, 2018

(30) Foreign Application Priority Data

Dec. 6, 2016    (EP) .................................... 16202508

(51) Int. Cl.
G03F 7/20    (2006.01)
(52) U.S. Cl.
CPC ...... G03F 7/70591 (2013.01); G03F 7/70633 (2013.01)
(58) Field of Classification Search
CPC ............. G03F 7/70625; G03F 7/70633; G03F 7/70683
See application file for complete search history.

(56) References Cited

U.S. PATENT DOCUMENTS 8,724,109 B2    5/2014    Setija et al.
8,823,922 B2    9/2014    Den Boef
(Continued)

FOREIGN PATENT DOCUMENTS

CN    103472004 B    4/2016
TW    2015-31662 A    8/2015
(Continued)

OTHER PUBLICATIONS

International Search Report and Written Opinion of the International Searching Authority directed to related International Patent Application No. PCT/EP2017/079467, dated Jan. 25, 2018; 13 pages.

*Primary Examiner* — Steven Whitesell Gordon
(74) *Attorney, Agent, or Firm* — Sterne, Kessler, Goldstein & Fox P.L.L.C.

(57) ABSTRACT

Methods of measuring a target formed by a lithographic process, a metrology apparatus and a polarizer assembly are disclosed. The target comprises a layered structure having a first periodic structure in a first layer and a second periodic structure in a second layer. The target is illuminated with polarized measurement radiation. Zeroth order scattered radiation from the target is detected. An asymmetry in the first periodic structure is derived using the detected zeroth order scattered radiation from the target. A separation between the first layer and the second layer is such that the detected zeroth order scattered radiation is independent of overlay error between the first periodic structure and the second periodic structure. The derived asymmetry in the first periodic structure is used to derive the correct overlay value between the first periodic structure and the second periodic structure.

20 Claims, 5 Drawing Sheets

(56) References Cited

U.S. PATENT DOCUMENTS

| | | | |
|---|---|---|---|
| 9,816,810 B2 | 11/2017 | Shchegrov et al. | |
| 2002/0158193 A1* | 10/2002 | Sezginer | G03F 7/70633 |
| | | | 250/237 G |
| 2004/0066517 A1 | 4/2004 | Huang et al. | |
| 2005/0018190 A1 | 1/2005 | Sezginer et al. | |
| 2006/0066855 A1 | 3/2006 | Boef et al. | |
| 2013/0010306 A1 | 1/2013 | Coene et al. | |
| 2015/0176979 A1* | 6/2015 | Mathijssen | G03F 7/70633 |
| | | | 355/77 |

FOREIGN PATENT DOCUMENTS

| | | |
|---|---|---|
| WO | WO 2015/018625 A1 | 2/2015 |
| WO | WO 2016/061128 A1 | 4/2016 |

\* cited by examiner

METHOD OF MEASURING A TARGET, METROLOGY APPARATUS, POLARIZER ASSEMBLY

BACKGROUND

Field of the Invention

The present invention relates to methods of measuring a target formed by a lithographic process, a metrology apparatus and a polarizer assembly.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Multiple layers, each having a particular pattern and material composition, are applied to define functional devices and interconnections of the finished product.

Current and next generation processes often rely on so-called multiple patterning techniques to produce device features having dimensions far smaller than can be printed directly by the lithographic apparatus. Multiple patterning steps, each having its own mask or reticle, are performed to define a desired device pattern in a single layer on the substrate. Many different examples of multiple patterning are known. In some processes, a regular, grid structure is formed as a basis for the desired device pattern. Then using a circuit-specific mask pattern, lines that form the grid structure are cut at specific locations to separate the lines into individual segments. The grid structure may be exceptionally fine in dimensions, with a pitch in the tens or even teens of nanometers.

In a lithographic process, it is desirable frequently to make measurements of structures created, e.g., for process control and verification. Various tools for making such measurements are known, including scanning electron microscopes, which are often used to measure critical dimension (CD), and specialized tools to measure overlay, the accuracy of alignment of two layers of a substrate. Final performance of manufactured device depends critically on the accuracy of positioning and dimensioning of the cut mask relative to the grid structure. (The cut mask in this context is what defines the circuit-specific locations at which the grid structure is modified to form functional circuits.) Overlay error may cause cutting or other modification to occur in a wrong place. Dimensional (CD) errors may cause cuts be too large, or too small (in an extreme case, cutting a neighboring grid line by mistake, or failing to cut the intended grid line completely).

Overlay measurements can be made by scattering radiation from gratings formed in different layers. Overlay can be derived from asymmetry in the diffracted radiation. Process induced variations in the shape of the lower grating, which is sometimes referred to as bottom grating asymmetry (BGA), can contribute asymmetry that is not caused by overlay and thereby reduce the accuracy of the overlay measurement. It is possible to improve accuracy by using measurement radiation having a wavelength that is less sensitive to this source of error than other wavelengths, but this restricts the range of wavelengths that can be used effectively for the overlay measurements. Alternatively, a dedicated lower grating pad that is separate from the target to be used for the overlay measurement can be provided. The dedicated lower grating pad is used to measure the shape of the lower grating. It is then assumed that the lower grating in the target will have the same shape. The measured shape of the lower grating is then used to correct for the effect of the shape in overlay measurements using the target. The provision of a dedicated lower grating pad reduces the amount of space available for device structures.

SUMMARY

In an aspect of the invention, there is provided a method of measuring a target formed by a lithographic process, the target comprising a layered structure having a first periodic structure in a first layer and a second periodic structure in a second layer, the method comprising: illuminating the target with polarized measurement radiation; detecting zeroth order scattered radiation from the target; and deriving an asymmetry in the first periodic structure using the detected zeroth order scattered radiation from the target, wherein: a separation between the first layer and the second layer is such that the detected zeroth order scattered radiation is independent of overlay error between the first periodic structure and the second periodic structure.

In an alternative aspect, there is provided a method of measuring a target formed by a lithographic process, comprising: illuminating the target with polarized measurement radiation, wherein the polarized measurement radiation comprises first radiation in a first wavelength band and second radiation in a second wavelength band, the first wavelength band being different from, and non-overlapping with, the second wavelength band; detecting zeroth order scattered radiation from scattering of the first radiation from a periodic structure in the target; and detecting higher than zeroth order scattered radiation from scattering of the second radiation from the periodic structure in the target.

In an alternative aspect, there is provided a metrology apparatus comprising: an illumination system configured to illuminate a target formed by a lithographic process with polarized measurement radiation, wherein the polarized measurement radiation comprises first radiation in a first wavelength band and second radiation in a second wavelength band, the first wavelength band being different from, and non-overlapping with, the second wavelength band; and a detection system configured to: detect zeroth order scattered radiation from scattering of the first radiation from a periodic structure in the target; and detect higher than zeroth order scattered radiation of the second radiation from the periodic structure in the target.

In an alternative aspect, there is provided a metrology apparatus comprising: a target formed by a lithographic process, the target comprising a layered structure having a first periodic structure in a first layer and a second periodic structure in a second layer; an illumination system configured to illuminate the target with polarized measurement radiation; a detection system configured to detect zeroth order scattered radiation from the target; and a processing unit configured to derive an asymmetry in the first periodic structure using the detected zeroth order scattered radiation from the target, wherein: a separation between the first layer and the second layer is such that the detected zeroth order scattered radiation is independent of overlay error between the first periodic structure and the second periodic structure.

In an alternative aspect, there is provided a polarizer assembly for use in metrology, comprising: a polarizing structure having a substantially planar form and configured to polarize radiation passing through the polarizing structure in a circular polarizing region, wherein: the polarizing region is configured to apply a first polarization to radiation passing through one of the two pairs of diametrically opposite quadrants of the circular polarizing region and to apply a second polarization, orthogonal to the first polarization, to the other pair of diametrically opposite quadrants of the circular polarizing region.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
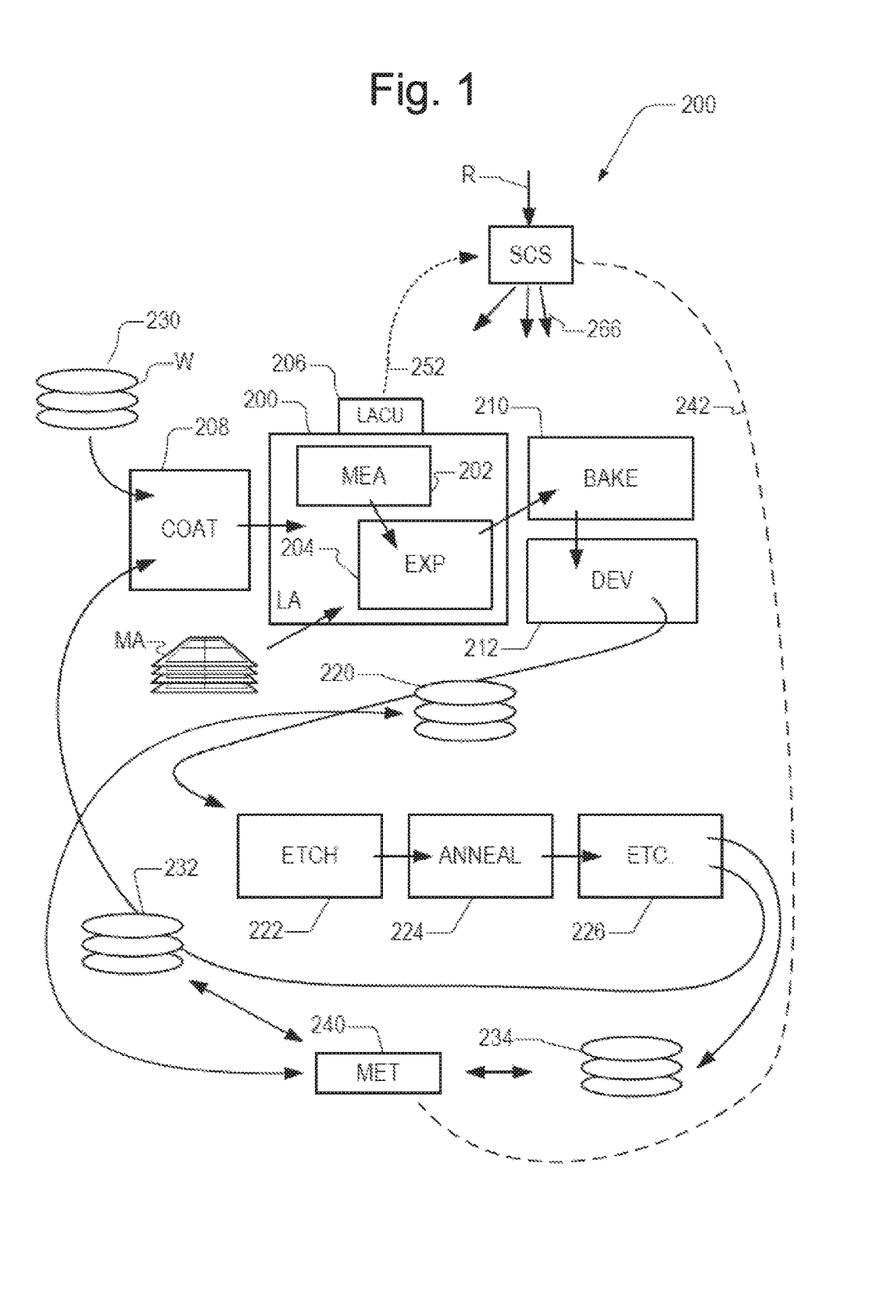
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example be of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the steps on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD. In accordance with embodiments of the present disclosure, the metrology apparatus is used to measure properties of structures having the same material and dimensions as functional product structures, which have been formed using one or more lithographic steps, etching and other processes after lithographic exposure.

Figure 2:
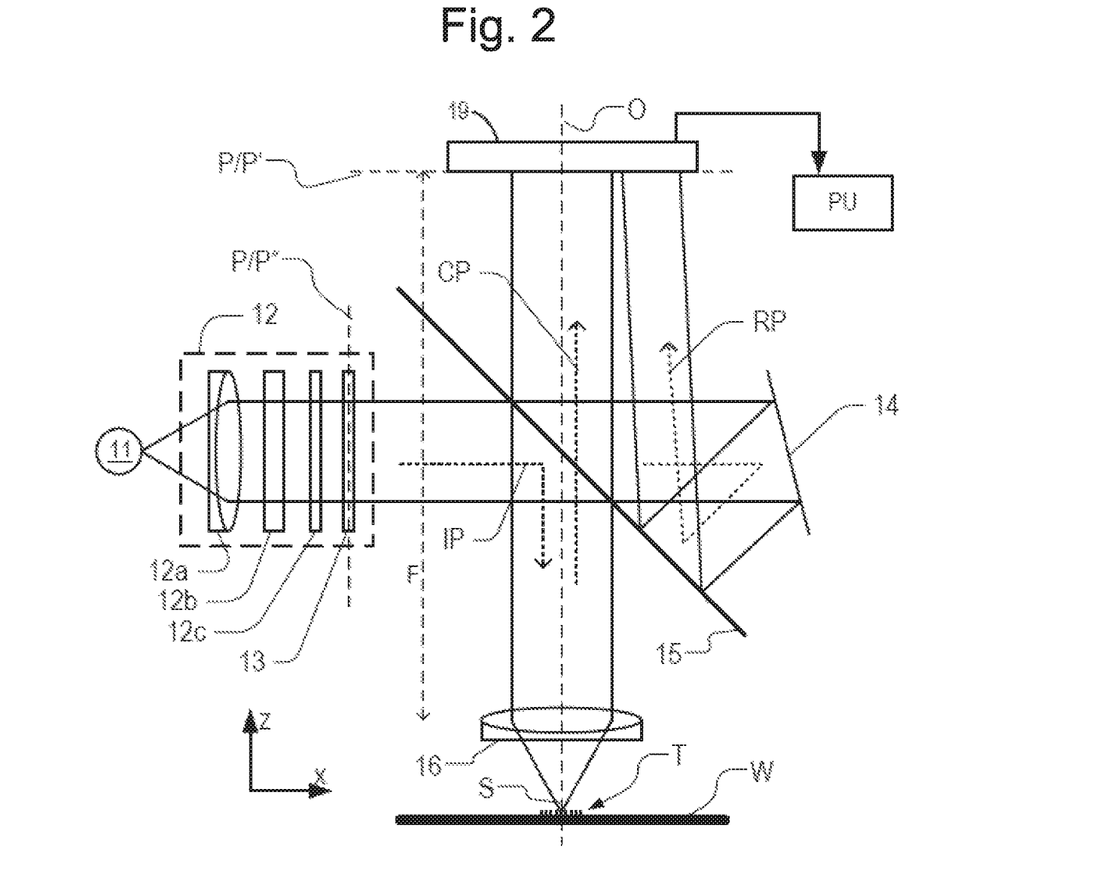
FIG. 2 depicts a scatterometer configured to capture an angle-resolved scatter spectrum.

FIG. 2 shows the basic elements of a known angle-resolved scatterometer that may be used in a metrology apparatus in embodiments of the present disclosure. In this type of metrology apparatus, radiation emitted by a radiation source 11 is conditioned by an illumination system 12. For example, illumination system 12 may provide collimation using lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), for example at least 0.9 or at least 0.95. Immersion fluid can be used to obtain numerical apertures greater than 1, if desired.

As in the lithographic apparatus LA, one or more substrate tables may be provided to hold the substrate W during measurement. Coarse and fine positioners may be configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and/or Y directions to acquire different targets, and in the Z direction to obtain a desired focusing of the optical system on the target. It is convenient to think and describe operations as if the objective lens and optical system being brought to different locations on the substrate, when in practice the optical system may remain substantially stationary and only the substrate moves. In other apparatuses, relative movement in one direction is implemented by physical movement of the substrate, while relative movement in orthogonal direction is implemented by physical movement of the optical system. Provided the relative position of the substrate and the optical system is correct, it does not matter in principle whether one or both of those is moving in the real world.

When the radiation beam is incident on the beam splitter 16 part of it is transmitted through the beam splitter (partially reflecting surface 15) and follows a reference path RP towards a reference mirror 14.

Radiation reflected by the substrate, including radiation diffracted by any metrology target T, is collected by lens 16 and follows a collection path CP in which it passes through partially reflecting surface 15 into a detector 19. The detector may be located in the back-projected pupil plane P, which is at the focal length F of the lens 16. In practice, the pupil plane itself may be inaccessible, and may instead be re-imaged with auxiliary optics (not shown) onto the detector located in a so-called conjugate pupil plane P'. The detector may be a two-dimensional detector so that a two-dimensional angular scatter spectrum or diffraction spectrum of a substrate target 30 can be measured. In the pupil plane or conjugate pupil plane, the radial position of radiation defines the angle of incidence/departure of the radiation in the plane of focused spot S, and the angular position around an optical axis O defines azimuth angle of the radiation. The detector 19 may be, for example, an array of CCD or CMOS sensors, and may use an integration time of, for example, 40 milliseconds per frame.

Radiation in reference path RP is projected onto a different part of the same detector 19 or alternatively on to a different detector (not shown). A reference beam is often used for example to measure the intensity of the incident radiation, to allow normalization of the intensity values measured in the scatter spectrum.

The various components of illumination system 12 can be adjustable to implement different metrology 'recipes' within the same apparatus. Color filter 12b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles. Aperture device 13 is located in a plane P''' conjugate with pupil plane P of objective lens 16 and the plane of the detector 19. In this way, an illumination profile defined by the aperture device defines the angular distribution of light incident on substrate radiation passing through different locations on aperture device 13.

The detector 19 may measure the intensity of scattered light at a single wavelength (or narrow wavelength range), or it may measure the intensity separately at multiple wavelengths, or integrated over a wavelength range. Furthermore, the detector may separately measure the intensity of transverse magnetic- and transverse electric-polarized light and/or the phase difference between the transverse magnetic-polarized light and transverse electric-polarized light.

In the known angle-resolved scatterometer represented schematically in FIG. 2, a metrology target T is provided on substrate W. For measurements, this target may comprise a 1-D grating, which is printed such that after development, it is an array of solid resist lines. Alternatively, the target may be a 2-D grating, which is printed such that after development, the grating is formed of solid resist pillars or vias (contact holes) in the resist. The bars, pillars or vias may alternatively be etched into the substrate. Measurements of parameters such as line widths and shapes, may be obtained by an iterative reconstruction process, performed by processing unit PU, from knowledge of the printing step and/or other scatterometry processes.

In addition to measurement of parameters by reconstruction, angle-resolved scatterometry is useful in the measurement of asymmetry of features in product and/or resist patterns. A particular application of asymmetry measurement is for the measurement of overlay, where the target comprises one set of periodic features superimposed on another. The concepts of asymmetry measurement using the instrument of FIG. 2 are described for example in published patent application US2006066855A1. Simply stated, while the positions of the higher diffraction orders ($1^{st}$ order and above) in the diffraction spectrum of a periodic target are determined only by the periodicity of the target, asymmetry of intensity levels in the diffraction spectrum is indicative of asymmetry in the individual features which make up the target. In the instrument of FIG. 2, where detector 19 may be an image sensor, such asymmetry in the higher diffraction orders appears directly as asymmetry in the pupil image recorded by detector 19. This asymmetry can be measured by digital image processing in unit PU, and calibrated against known values of overlay.

Figure 3:
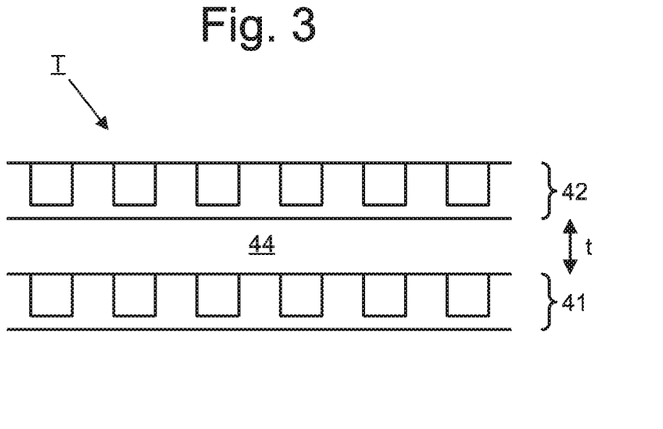
FIG. 3 depicts schematically in side section an example target having a first periodic structure in a first layer and a second periodic structure in a second layer.

FIG. 3 depicts a target T formed by a lithographic process and suitable for use in methods of measuring a target according to various embodiments. The target T comprises a layered structure. The layered structure has a first periodic structure (e.g. 1D or 2D grating) in a first layer 41 and a second periodic structure (e.g. 1D or 2D grating) in a second layer 42. In the example shown the first layer 41 is separated from the second layer 42 by an intermediate layer 44. The first layer 41 is separated from the second layer 42 by distance t.

Figure 4:
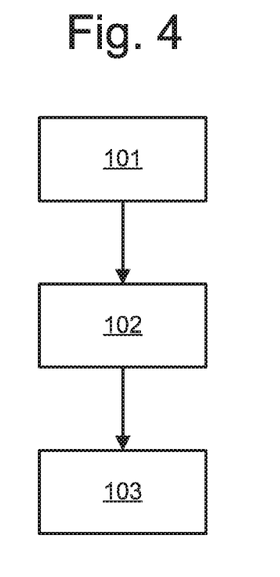
FIG. 4 depicts an example method of measuring a target formed by a lithographic process.

FIG. 4 depicts a sequence of steps of a method of measuring a target T according to an embodiment. In step 101, the target T is illuminated with polarized measurement radiation. In step 102, zeroth order scattered radiation from the target T is detected. In step 103, an asymmetry in the first periodic structure is derived using the detected zeroth order scattered radiation from the target T. The separation t between the first layer 41 and the second layer 42 is such that the detected zeroth order scattered radiation is independent of overlay error between the first periodic structure and the second periodic structure. The inventors have recognized that where the first periodic structure is sufficiently separated from the second periodic structure, the zeroth order scattered radiation contains information about an asymmetry in the first periodic structure but no significant contribution from any overlay error between the first periodic structure and the second periodic structure. This allows a measurement of the asymmetry in the first periodic structure to be obtained independently of the overlay error. The asymmetry information is present in a crossed polarization component (e.g. horizontal polarization to vertical polarization or vice versa) of the zeroth order scattered radiation and is not present in the parallel polarized component (e.g. horizontal polarization to horizontal polarization or vertical polarization to vertical polarization). This is therefore different to the traditional approach to measuring overlay using higher than zeroth order scattered radiation, where the overlay information is present in both crossed and parallel polarization components.

In an embodiment the separation between the first layer 41 and second layer 42 is greater than $\lambda/20$, optionally greater than $\lambda/15$, optionally greater than $\lambda/10$, optionally greater than $\lambda/5$, where $\lambda$ is a wavelength of measurement radiation contributing to the detected zeroth order scattered radiation. Methods of embodiments may therefore be applied after a lithographic development step but prior to a subsequent etching step, where relative large separations between periodic structures in different layers are present.

Due to reciprocity and symmetry relationships in diffraction, it is normally expected that asymmetry information will be present only in higher than zeroth order scattered radiation. However, the inventors have recognized that, even where only zeroth order propagation modes are present, asymmetry information will be encoded in higher than zeroth order (non-propagating) evanescent modes.

If the first periodic structure and the second periodic structure were close enough to each other that an evanescent field generated by the first periodic structure interacts with an evanescent field generated by the second periodic structure, the fields could couple into the zeroth order scattered radiation. The zeroth order scattered radiation propagates out into space and can thus be detected and analyzed to detect the asymmetry information. In this case, however, asymmetry due to overlay error and asymmetry due to asymmetry in the first periodic structure both contribute to the measured asymmetry and cannot easily be distinguished from each other. In contrast, the relatively large separation between the layers of embodiments of the present disclosure (e.g. greater than $\lambda/20$), as is typically the case in current "after develop" metrology cases, means that evanescent fields from the first periodic structure and the second periodic structure do not interact with each other significantly. This is because the strength of the evanescent waves decays exponentially with depth. However, the evanescent field from scattering from the first periodic structure will still couple into zeroth order scattering from the first periodic structure. Analysis of the zeroth order scattering can therefore be used to measure the asymmetry in the first periodic structure independently of overlay error.

In an embodiment, the first periodic structure and the second periodic structure each comprise a periodic component having the same pitch and orientation. The pitch of the periodic component and a wavelength of measurement radiation contributing to the detected zeroth order scattered radiation are such that no propagating higher than zeroth order scattered radiation is generated by the periodic component of the first periodic structure or the periodic component of the second periodic structure by the measurement radiation contributing to the detected zeroth order scattered radiation.

Figure 5:
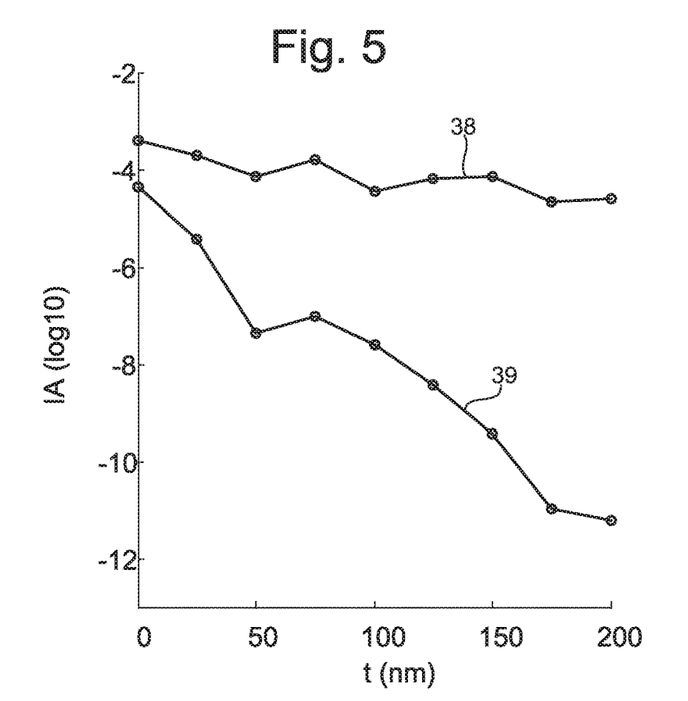
FIG. 5 is a graph comparing the dependence of an intensity asymmetry signal (IA) on separation (t) between the first and second layers, for first periodic structure asymmetry (38) and overlay (39)—the overlay signal is shown to fall orders of magnitude faster than the first periodic structure asymmetry.

FIG. 5 shows how an intensity asymmetry is expected to vary as a function of separation (t) between the first layer 41 and the second layer 42 for a signal (38) from the first periodic structure asymmetry and for a signal (39) from overlay error. The signal is shown in logarithmic scale. For small separations, the overlay error signal is large (due to large overlap between evanescent fields from the different layers), but as the layers move further apart the signal (39) from the overlay error rapidly falls by orders of magnitude. The signal (38) from the first periodic structure asymmetry, which does not rely on overlap of evanescent fields from different layers, is relatively independent of the separation t between the layers.

Asymmetry can arise in the first periodic structure due to processing variations. Such asymmetry is known in the art and sometimes referred to as bottom grating asymmetry (BGA). The asymmetry can reduce the accuracy of measurements of overlay error.

The contribution of the asymmetry in the first periodic structure to the zeroth order scattered radiation is present in a polarization component that is orthogonal to the polarization of the measurement radiation illuminating the target. In order to improve sensitivity, in an embodiment the detecting of zeroth order scattered radiation comprises detecting a crossed polarization component of the zeroth order scattered radiation. The detected crossed polarization component is then used to derive the asymmetry in the first periodic structure.

In an embodiment, the method further comprises detecting higher than zeroth order scattered radiation from the target T. An overlay error between the first periodic structure and the second periodic structure is then derived using a combination of the detected zeroth order scattered radiation (e.g. using illumination of a particular wavelength which only generates a zeroth order and no higher propagating orders) and the detected higher than zeroth order scattered radiation (e.g. using illumination at another wavelength). The detected higher than zeroth order scattered radiation contains a contribution from the overlay error between the first periodic structure and the second periodic structure and a contribution from the asymmetry in the first periodic structure. In an embodiment, these contributions can be seen in the intensity difference $\Delta I_N$ between the first orders (+1 and −1), as follows:

$$\Delta I_N = K \cdot OV + \alpha \cdot BGA,$$

where OV is overlay error, BGA is asymmetry in the first periodic structure (i.e. bottom grating asymmetry), and K and α are the overlay sensitivity and BGA sensitivity. K and α can be derived using standard techniques known in the art. Calibration data could be generated from known values of OV and BGA, for example, and used as a look-up table. SEM measurements could be used for example to measure overlay error and/or BGA independently for various different values and correlated against measurements of $\Delta I_N$ to generate the look-up table. Alternatively or additionally, computational reconstruction could be used.

The detected zeroth order scattered radiation is independent of overlay error between the first periodic structure and the second periodic structure (so overlay asymmetry is effectively zero). The detected zeroth order scattered radiation therefore provides a quantity $\Delta I_{XP}$ which can be written as follows:

$$\Delta I_{XP} = \beta \cdot BGA,$$

where β is the BGA sensitivity. β depends on the specific materials and processes used and can be estimated using various techniques, including those mentioned above in the context of determining K and α. Thus, for example, SEM measurements can be used to determine how the groove profile of the bottom grating (first periodic structure) is related to the asymmetry as detected using the zeroth order scattered radiation. Calibration data can be generated and used to form a look-up table for use with subsequent measurements. SEM measurements are routinely performed for various process related optimizations, so this measurement can potentially be a part of such already existing steps.

Once K, α and β are known it is clear that the overlay error OV can be distinguished from the contribution from asymmetry in the first periodic structure in the detected higher than zeroth order scattered radiation. Thus, the asymmetry in the first periodic structure derived using the detected zeroth order scattered radiation can be used to extract the overlay error from the detected higher than zeroth order scattered radiation with higher precision than would otherwise be possible.

The above-described extraction of overlay error can be implemented particularly efficiently if the detection of the zeroth order scattered radiation is performed in parallel with the detection of the higher than zeroth order scattered radiation. Example embodiments for achieving this are described below.

Figure 6:
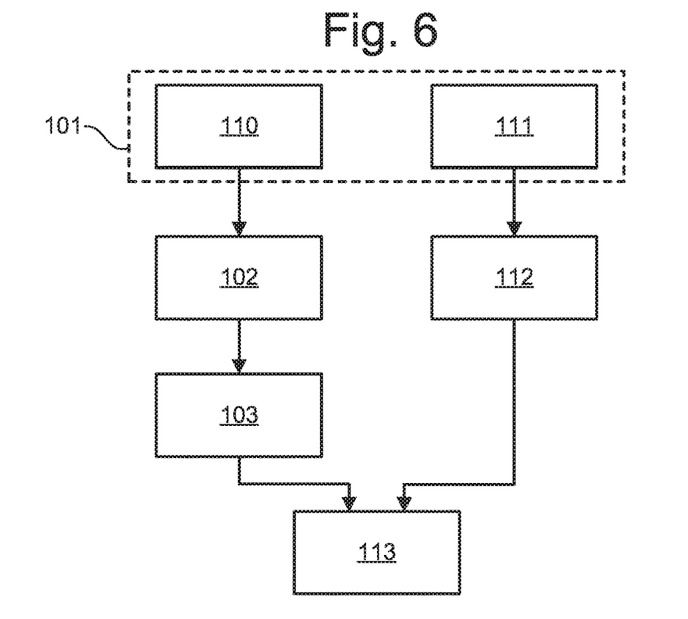
FIG. 6 depicts a further example method of measuring a target formed by a lithographic process.

In an embodiment, the measurement radiation comprises first radiation in a first wavelength band and second radiation in a second wavelength band. A flow chart depicting the framework of methods using such first radiation and second radiation is shown in FIG. 6. The first wavelength band is different from, and non-overlapping with, the second wavelength band. In methods of this type, the step 101 of illuminating the target T with polarized measurement radiation comprises two components: a step 110 in which the illumination is performed using the first radiation and a step 111 in which the illumination is performed using the second radiation. Step 110 may be performed at the same time as step 111 (in parallel) or may be performed at a different time.

In step 102, zeroth order scattered radiation, provided predominantly by the first radiation, is detected. The zeroth order scattered radiation may be provided predominantly by the first radiation (and not predominantly by the second radiation) because the first wavelength band is higher than the second wavelength band. In an embodiment, the first wavelength band is selected so that it is high enough (in relation to the pitch of relevant structures in the target T) that no propagating higher than zeroth order scattered radiation is derived from scattering of the first radiation from the target T.

In corresponding step 112, higher than zeroth order scattered radiation, provided predominantly by the second radiation, is detected. The higher than zeroth order scattered radiation may be provided predominantly by the second radiation (and not predominantly by the first radiation) because the first wavelength band is higher than the second wavelength band and, optionally, is such that no propagating higher than zeroth order scattered radiation is derived from scattering of the first radiation from the target T.

In step 103, an asymmetry in the first periodic structure is derived as in step 103 of FIG. 4 discussed above. In step 113, the asymmetry in the first periodic structure is used in combination with the detected higher than zeroth order scattered radiation detected in step 112 to extract the overlay error, e.g. by determined BGA from $\Delta I_{XP} = \beta \cdot BGA$ using a look-up table to determine β, and using the determined BGA, together with values for K and α from calibration data for example, to determine overlay OV from measurements of intensity difference $\Delta I_N$ between the first orders (+1 and −1) via the expression $\Delta I_N = K \cdot OV + \alpha \cdot BGA$.

Figure 7:
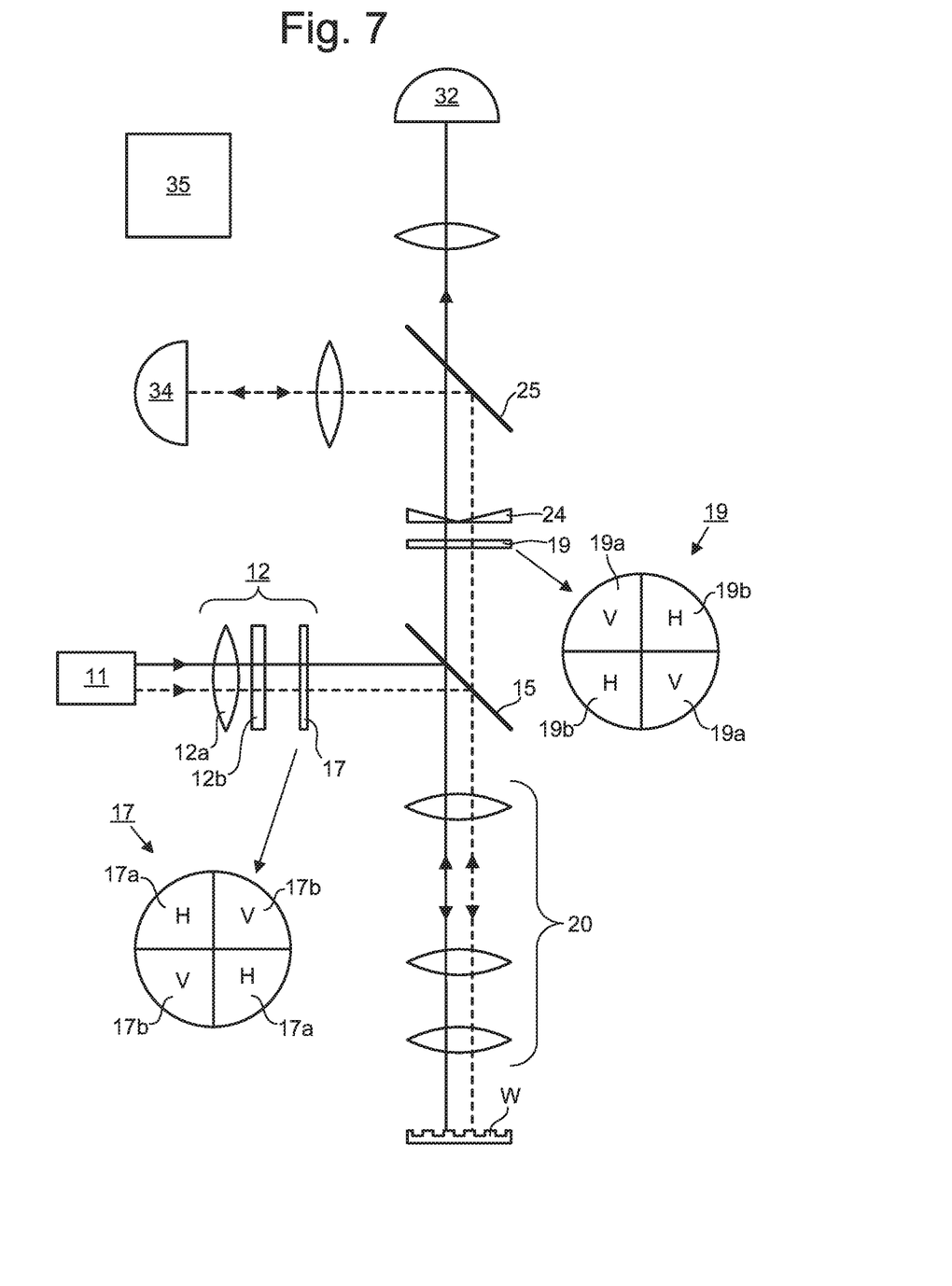
FIG. 7 depicts a metrology apparatus.

Example apparatus for performing methods according to embodiments is depicted in FIG. 7. The apparatus may be referred to as a metrology apparatus. The apparatus may contain elements of the apparatus of FIG. 2 discussed above, except where stated otherwise below. The apparatus comprises an illumination system 12 configured to illuminate a target T formed by a lithographic process with polarized measurement radiation. The illumination system 12 may optionally comprise a lens system 12a and a color filter 12b configured to operate as in FIG. 2. A first polarizer assembly 17 is additionally provided, operation of which will be described below.

A source 11 provides first radiation in a first wavelength band (solid lines) and second radiation in a second wavelength band (broken lines). The first radiation and the second radiation may have any of the characteristics that have been described above in relation to the methods of FIGS. 4 and 6.

The apparatus further comprises a detection system that detects zeroth order scattered radiation from scattering of the first radiation from a periodic structure in the target T and detects higher than zeroth order scattered radiation of the second radiation from the periodic structure in the target T. A lens system 20 directs the first radiation and the second radiation onto the target T. The first radiation and the second radiation may be directed onto the target T simultaneously. The detection system directs the scattered radiation from scattering of the first radiation onto a first detector 32 and directs the scattered radiation from scattering of the second radiation onto a second detector 34, different from the first detector 32. Thus, scattered radiation from scattering of the first radiation from the target T can be detected independently of scattered radiation from scattering of the second radiation from the target T.

In the embodiment shown, a dichroic beam splitter 25 is used to selectively redirect the first radiation and the second radiation as desired with minimal loss. Other arrangements are possible. For example, in a case where both of the first radiation and the second radiation are directed towards both the first detector 32 and the second detector 34 (e.g. using a non-dichroic beam splitter in place of the dichroic beam splitter 25), color filters could be provided in front of each of the two detectors 32, 34 to allow only the appropriate radiation to reach each detector 32, 34. The detection system further comprises a second polarizer assembly 19 (described in further detail below) and, in this particular embodiment, a four quadrant optical wedge 24 for directing different components of the scattered light onto desired portions of the first detector 32 and the second detector 34.

A processing unit 35 is provided for performing any of the deriving steps described above with reference to FIGS. 4 and 6, using outputs from the first detector 32 and second detector 34. The processing unit 35 may be implemented using any of the wide variety of hardware, firmware and software techniques available for implementing computing or logic operations. A computer program product may be provided comprising machine readable instructions which, when run on a suitable processor, cause the processor to perform the deriving step or deriving steps of the any of the above methods.

The metrology apparatus is able to implement methods according to embodiments particularly efficiently due to the presence of the first polarizer assembly 17 and the second polarizer assembly 19, and their novel interrelationship. This is described in detail below.

The metrology apparatus of FIG. 7 is an example of an embodiment in which an optical system is configured to perform illumination of a target T and detection of scattered radiation from the target T, and in which a first polarizer assembly 17 and a second polarizer assembly 19 are provided. The apparatus is configured so that measurement radiation passes through a first pupil plane of the optical system prior to illuminating the target T. The first pupil plane may be a plane conjugate to a pupil plane of an objective lens of the lens system 20, for example. The apparatus is further configured so that scattered radiation passes through a second pupil plane of the optical system after scattering from the target T. The second pupil plane may be a plane conjugate to a pupil plane of an objective lens of the lens system 20, for example. The first polarizer assembly 17 is provided in the first pupil plane. The second polarizer assembly 19 is provided in the second pupil plane.

The first polarizer assembly 17 is configured so that radiation passing through a first region 17a in the first pupil plane is polarized by the first polarizer assembly 17 in an opposite (orthogonal) sense to radiation passing through a second region 17b in the first pupil plane. In the present embodiment, the first region 17a comprises diametrically opposite quadrants of a circular polarizing region. In the particular example of FIG. 7, the first region 17a polarizes in a horizontal direction H and second region 17b polarizes in a vertical direction V.

The second polarizer assembly 19 is configured so that radiation passing through a first region 19a in the second pupil plane is polarized by the second polarizer assembly 19 in an opposite (orthogonal) sense to radiation passing through a second region 19b in the second pupil plane. In the particular example of FIG. 7, the first region 19a polarizes in a vertical direction V and second region 19b polarizes in a horizontal direction H. The first region 17a and second region 17b of the first polarizer assembly 17 have the same shape, size and relative positions as the first region 19a and second region 19b of the second polarizer assembly 19. The first region 17a of the first polarizer assembly 17 is thus crossed (i.e. has an opposite or orthogonal polarization) relative to the first region 19a of the second polarizer assembly 19 and the second region 17b of the first polarizer assembly 17 is crossed relative to the second region 19b of the second polarizer assembly 19. Radiation that passes through the same regions of both assemblies will therefore be blocked, whereas radiation which passes though different regions will be passed.

The first regions 17a and 19a and the second regions 17b and 19b are configured so that the following functionality is achieved in use of the apparatus. All radiation contributing to zeroth order scattered radiation that has passed through the first region 17a of the first polarizer assembly 17 subsequently passes through the first region 19a of the second polarizer assembly 19. All radiation contributing to zeroth order scattered radiation that has passed through the second region 17b of the first polarizer assembly 17 subsequently passes through the second region 19b of the second polarizer assembly 19. At least a portion of radiation contributing to higher than zeroth order scattered radiation that has passed through the first region 17a of the first polarizer assembly 17 subsequently passes through the second region 19b of the second polarizer assembly 19. At least a portion of radiation contributing to higher than zeroth order scattered radiation that has passed through the second region 17b of the first polarizer assembly 17 subsequently passes through the first region 19a of the second polarizer assembly 19.

The above functionality can be achieved for example using first and second polarizer assemblies that each comprise a polarizing structure having a substantially planar form configured to polarize radiation passing through the polarizing structure in a circular polarizing region, wherein the polarizing region is configured to apply a first polarization V to radiation passing through one of the two pairs of diametrically opposite quadrants (e.g. forming a first region 17a or 19a) of the circular polarizing region and to apply a second polarization H, orthogonal to the first polarization V, to the other pair of diametrically opposite quadrants (e.g. forming a second region 17b or 19b) of the circular polarizing region.

In such an arrangement, zeroth order (specular) reflection from the target T will always result in radiation moving from one quadrant when it passes through the first pupil plane to the diametrically opposite quadrant when it passes through the second pupil plane. If the target T comprises a periodic structure such as a grating, however, higher than zeroth order scattered radiation from the periodic structure can cause the radiation to move from one quadrant to a neighboring (not diametrically opposite) quadrant. The particular quadrant depends on the order of the diffraction (e.g. +1 or −1) and the orientation of the grating (e.g. X or Y) of the periodic structure.

Thus, the combination of the first polarizer assembly 17 and the second polarizer assembly 19 provides a convenient way of blocking all unwanted components of the zeroth order scattered radiation (i.e. the components which do not contain information about the asymmetry in the first periodic structure) while at the same time passing the higher than zeroth order scattered radiation potentially without any restriction and ensuring that the first radiation and the second radiation are polarized before they reach the target T.

Although patterning devices in the form of a physical reticle have been described, the term "patterning device" in this application also includes a data product conveying a pattern in digital form, for example to be used in conjunction with a programmable patterning device.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Further embodiments according to the invention are further described in below numbered clauses:

1. A method of measuring a target formed by a lithographic process, the target comprising a layered structure having a first periodic structure in a first layer and a second periodic structure in a second layer, the method comprising:
    illuminating the target with polarized measurement radiation;
    detecting zeroth order scattered radiation from the target; and
    deriving an asymmetry in the first periodic structure using the detected zeroth order scattered radiation from the target, wherein:
    a separation between the first layer and the second layer is such that the detected zeroth order scattered radiation is independent of overlay error between the first periodic structure and the second periodic structure.

2. The method of clause 1, wherein:
    the detecting of zeroth order scattered radiation comprises detecting a crossed polarization component of the zeroth order scattered radiation;
    the deriving of the asymmetry uses the detected crossed polarization component of the zeroth order scattered radiation.

3. The method of clause 1 or 2, further comprising:
    detecting higher than zeroth order scattered radiation from the target; and
    deriving an overlay error between the first periodic structure and the second periodic structure using a combination of the detected zeroth order scattered radiation and the detected higher than zeroth order scattered radiation.

4. The method of clause 3, wherein:
    the detected higher than zeroth order scattered radiation contains a contribution from the overlay error between the first periodic structure and the second periodic structure and a contribution from the asymmetry in the first periodic structure; and
    the asymmetry in the first periodic structure derived using the detected zeroth order scattered radiation is used to extract the overlay error from the detected higher than zeroth order scattered radiation.

5. The method of clause 3 or 4, wherein:
    the measurement radiation comprises first radiation in a first wavelength band and second radiation in a second wavelength band, the first wavelength band being different from, and non-overlapping with, the second wavelength band;
    the detected zeroth order scattered radiation is predominantly provided by the first radiation; and
    the detected higher than zeroth order scattered radiation is predominantly provided by the second radiation.

6. The method of clause 5, wherein the first wavelength band is higher than the second wavelength band.

7. The method of clause 6, wherein no propagating higher than zeroth order scattered radiation is derived from scattering of the first radiation from the target.

8. The method of any of clauses 5-7, wherein scattered radiation from scattering of the first radiation from the target is detected independently of scattered radiation from scattering of the second radiation from the target.

9. The method of any preceding clause, wherein the deriving of the asymmetry in the first periodic structure uses calibration data or computational reconstruction.

10. The method of any preceding clause, wherein the method is applied to a target after a lithographic development step but prior to a subsequent etching step.

11. The method of any preceding clause, wherein the separation between the first layer and second layer is greater than $\lambda/20$, where $\lambda$ is a wavelength of measurement radiation contributing to the detected zeroth order scattered radiation.

12. The method of any preceding clause, wherein the first periodic structure and the second periodic structure each comprise a periodic component having the same pitch and orientation.

13. The method of clause 12, wherein the pitch of the periodic component and a wavelength of measurement radiation contributing to the detected zeroth order scattered radiation are such that no propagating higher than zeroth order scattered radiation is generated by the periodic component of the first periodic structure or the periodic component of the second periodic structure by the measurement radiation contributing to the detected zeroth order scattered radiation.

14. The method of any preceding clause, wherein:
    an optical system is used to illuminate the target and to detect the scattered radiation;
    the measurement radiation passes through a first pupil plane of the optical system prior to illuminating the target;
    the scattered radiation passes through a second pupil plane of the optical system after scattering from the target;
    a first polarizer assembly is provided in the first pupil plane;
    a second polarizer assembly is provided in the second pupil plane; and
    each of the first polarizer assembly and the second polarizer assembly is configured such that:
    radiation passing through a first region in the pupil plane is polarized by the polarizer assembly in an orthogonal sense to radiation passing through a second region in the pupil plane.

15. The method of clause 14, wherein:
    all radiation contributing to zeroth order scattered radiation that has passed through the first region of the first polarizer assembly subsequently passes through the first region of the second polarizer assembly; and
    at least a portion of radiation contributing to higher than zeroth order scattered radiation that has passed through the first region of the first polarizer assembly subsequently passes through the second region of the second polarizer assembly; and
    the first region of the first polarizer assembly is crossed relative to the first region of the second polarizer assembly and the second region of the first polarizer assembly is crossed relative to the second region of the second polarizer assembly.

16. A method of measuring a target formed by a lithographic process, comprising:

illuminating the target with polarized measurement radiation, wherein the polarized measurement radiation comprises first radiation in a first wavelength band and second radiation in a second wavelength band, the first wavelength band being different from, and non-overlapping with, the second wavelength band;

detecting zeroth order scattered radiation from scattering of the first radiation from a periodic structure in the target; and detecting higher than zeroth order scattered radiation from scattering of the second radiation from the periodic structure in the target.

17. A metrology apparatus comprising:

an illumination system configured to illuminate a target formed by a lithographic process with polarized measurement radiation, wherein the polarized measurement radiation comprises first radiation in a first wavelength band and second radiation in a second wavelength band, the first wavelength band being different from, and non-overlapping with, the second wavelength band; and a detection system configured to:

detect zeroth order scattered radiation from scattering of the first radiation from a periodic structure in the target; and detect higher than zeroth order scattered radiation of the second radiation from the periodic structure in the target.

18. The apparatus of clause 17, wherein the target comprises a layered structure having a first periodic structure in a first layer and a second periodic structure in a second layer.

19. The apparatus of clause 18, further comprising:

a processing unit configured to derive an asymmetry in the first periodic structure from the detected zeroth order scattered radiation from scattering of the first radiation.

20. The apparatus of clause 19, wherein:

the detecting of zeroth order scattered radiation comprises detecting a crossed polarization component of the zeroth order scattered radiation; and the deriving of the asymmetry uses the detected crossed polarization component of the zeroth order scattered radiation.

21. The apparatus of clause 19 or 20, wherein the processing unit is further configured to:

derive an overlay error between the first periodic structure and the second periodic structure using a combination of the detected zeroth order scattered radiation and the detected higher than zeroth order scattered radiation.

22. The apparatus of any of clauses 18-21, wherein the separation between the first layer and second layer is greater than $\lambda/20$, where $\lambda$ is a wavelength of measurement radiation contributing to the detected zeroth order scattered radiation from the target.

23. The apparatus of any of clauses 18-22, wherein the first periodic structure and the second periodic structure each comprise a periodic component having the same pitch and orientation.

24. The apparatus of clause 23, wherein the pitch of the periodic component and a wavelength of measurement radiation contributing to the detected zeroth order scattered radiation are such that no propagating higher than zeroth order scattered radiation is generated by the periodic component of the first periodic structure or the periodic component of the second periodic structure by the measurement radiation contributing to the detected zeroth order scattered radiation.

25. The apparatus of any of clauses 17-24, wherein the first wavelength band is higher than the second wavelength band.

26. The apparatus of any of clauses 17-25, wherein the detection system is configured to detect scattered radiation from scattering of the first radiation from the target independently of scattered radiation from scattering of the second radiation from the target.

27. The apparatus of clause 26, wherein the illumination system is configured to illuminate the target simultaneously with the first radiation and the second radiation and the detection system is configured to direct the scattered radiation from scattering of the first radiation onto a first detector and to direct the scattered radiation from scattering of the second radiation onto a second detector, different from the first detector.

28. The apparatus of any of clauses 17-27, comprising:

an optical system configured to perform the illumination of the target and the detection of the scattered radiation; and a first polarizer assembly and a second polarizer assembly, wherein the apparatus is configured such that:

the measurement radiation passes through a first pupil plane of the optical system prior to illuminating the target;

the scattered radiation passes through a second pupil plane of the optical system after scattering from the target;

the first polarizer assembly is provided in the first pupil plane;

the second polarizer assembly is provided in the second pupil plane; and each of the first polarizer assembly and the second polarizer assembly is configured such that:

radiation passing through a first region in the pupil plane is polarized by the polarizer assembly in an orthogonal sense to radiation passing through a second region in the pupil plane.

29. The apparatus of clause 28, wherein the apparatus is configured such that in use:

all radiation contributing to zeroth order scattered radiation that has passed through the first region of the first polarizer assembly subsequently passes through the first region of the second polarizer assembly; and at least a portion of radiation contributing to higher than zeroth order scattered radiation that has passed through the first region of the first polarizer assembly subsequently passes through the second region of the second polarizer assembly; and the first region of the first polarizer assembly is crossed relative to the first region of the second polarizer assembly and the second region of the first polarizer assembly is crossed relative to the second region of the second polarizer assembly.

30. A metrology apparatus comprising:

a target formed by a lithographic process, the target comprising a layered structure having a first periodic structure in a first layer and a second periodic structure in a second layer;

an illumination system configured to illuminate the target with polarized measurement radiation;

a detection system configured to detect zeroth order scattered radiation from the target; and a processing unit configured to derive an asymmetry in the first periodic structure using the detected zeroth order scattered radiation from the target, wherein:

a separation between the first layer and the second layer is such that the detected zeroth order scattered radiation is independent of overlay error between the first periodic structure and the second periodic structure.

31. A polarizer assembly for use in metrology, comprising:

a polarizing structure having a substantially planar form and configured to polarize radiation passing through the polarizing structure in a circular polarizing region, wherein:

the polarizing region is configured to apply a first polarization to radiation passing through one of the two pairs of diametrically opposite quadrants of the circular polarizing region and to apply a second polarization, orthogonal to the first polarization, to the other pair of diametrically opposite quadrants of the circular polarizing region.

32. A computer program product comprising machine readable instructions which, when run on a suitable processor, cause the processor to perform the deriving step or deriving steps of the method of any of clauses 1-16.

33. A lithographic system comprising:
a lithographic apparatus for use in a lithographic process; and
a metrology apparatus according to any of clauses 17-30 for use in measuring a target formed by the lithographic process.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a target formed by a lithographic process, the target comprising a layered structure having a first periodic structure in a first layer and a second periodic structure in a second layer, the method comprising:
   illuminating the target with polarized measurement radiation;
   detecting zeroth order scattered radiation from the target; and
   deriving an asymmetry in the first periodic structure using the detected zeroth order scattered radiation from the target,
   wherein a separation between the first layer and the second layer is such that the zeroth order scattered radiation is independent of overlay error between the first periodic structure and the second periodic structure.

2. The method of claim 1, wherein:
the detecting comprises detecting a crossed polarization component of the zeroth order scattered radiation; and
the deriving uses the crossed polarization component of the zeroth order scattered radiation.

3. The method of claim 1, further comprising:
detecting higher than zeroth order scattered radiation from the target; and
deriving an overlay error between the first periodic structure and the second periodic structure using a combination of the zeroth order scattered radiation and the higher than zeroth order scattered radiation.

4. The method of claim 3, wherein:
the detected higher than zeroth order scattered radiation contains a contribution from the overlay error between the first periodic structure and the second periodic structure and a contribution from the asymmetry in the first periodic structure; and
the asymmetry in the first periodic structure derived using the detected zeroth order scattered radiation is used to extract the overlay error from the detected higher than zeroth order scattered radiation.

5. The method of claim 3, wherein:
the measurement radiation comprises first radiation in a first wavelength band and second radiation in a second wavelength band, the first wavelength band being different from, and non-overlapping with, the second wavelength band;
the zeroth order scattered radiation is predominantly provided by the first radiation; and
the higher than zeroth order scattered radiation is predominantly provided by the second radiation.

6. The method of claim 5, wherein the first wavelength band is higher than the second wavelength band.

7. The method of claim 6, wherein no propagating higher than zeroth order scattered radiation is derived from scattering of the first radiation from the target.

8. The method of claim 5, wherein scattered radiation from scattering of the first radiation from the target is detected independently of scattered radiation from scattering of the second radiation from the target.

9. The method of claim 1, wherein the deriving of the asymmetry in the first periodic structure uses calibration data or computational reconstruction.

10. The method of claim 1, wherein the method is applied to a target after a lithographic development step but prior to a subsequent etching step.

11. The method of claim 1, wherein:
the separation between the first layer and second layer is greater than $\lambda/20$; and
$\lambda$ is a wavelength of measurement radiation contributing to the zeroth order scattered radiation.

12. The method of claim 1, wherein the first periodic structure and the second periodic structure each comprise a periodic component having a same pitch and orientation.

13. The method of claim 12, wherein the pitch of the periodic component and a wavelength of measurement radiation contributing to the zeroth order scattered radiation are such that no propagating higher than zeroth order scattered radiation is generated by the periodic component of the first periodic structure or the periodic component of the second periodic structure by the measurement radiation contributing to the zeroth order scattered radiation.

14. The method of claim 1, wherein:
an optical system is used to illuminate the target and to detect the scattered radiation;
the measurement radiation passes through a first pupil plane of the optical system prior to illuminating the target;
the scattered radiation passes through a second pupil plane of the optical system after scattering from the target;
a first polarizer assembly is provided in the first pupil plane;
a second polarizer assembly is provided in the second pupil plane; and
each of the first polarizer assembly and the second polarizer assembly is configured such that:

radiation passing through a first region in the pupil plane is polarized by the polarizer assembly in an orthogonal sense to radiation passing through a second region in the pupil plane.

15. The method of claim 14, wherein:

all radiation contributing to the zeroth order scattered radiation that has passed through the first region of the first polarizer assembly subsequently passes through the first region of the second polarizer assembly; and at least a portion of radiation contributing to higher than zeroth order scattered radiation that has passed through the first region of the first polarizer assembly subsequently passes through the second region of the second polarizer assembly; and the first region of the first polarizer assembly is crossed relative to the first region of the second polarizer assembly and the second region of the first polarizer assembly is crossed relative to the second region of the second polarizer assembly.

16. A metrology apparatus comprising:

an illumination system configured to illuminate a target formed by a lithographic process with polarized measurement radiation, wherein the polarized measurement radiation comprises first radiation in a first wavelength band and second radiation in a second wavelength band, the first wavelength band being different from, and non-overlapping with, the second wavelength band; and a detection system configured to:
detect zeroth order scattered radiation predominantly from scattering of the first radiation from a periodic structure in the target; and
detect higher than zeroth order scattered radiation predominantly from scattering of the second radiation from the periodic structure in the target.

17. The metrology apparatus of claim 16, comprising:

an optical system configured to perform the illumination of the target and the detection of the scattered radiation; and a first polarizer assembly and a second polarizer assembly, wherein the metrology apparatus is configured such that:
the measurement radiation passes through a first pupil plane of the optical system prior to illuminating the target;
the scattered radiation passes through a second pupil plane of the optical system after scattering from the target;
the first polarizer assembly is provided in the first pupil plane;
the second polarizer assembly is provided in the second pupil plane; and
each of the first polarizer assembly and the second polarizer assembly is configured such that radiation passing through a first region in the pupil plane is polarized by the polarizer assembly in an orthogonal sense to radiation passing through a second region in the pupil plane.

18. The metrology apparatus of claim 17, wherein the metrology apparatus is configured such that in use:

all radiation contributing to the zeroth order scattered radiation that has passed through the first region of the first polarizer assembly subsequently passes through the first region of the second polarizer assembly;

at least a portion of radiation contributing to the higher than zeroth order scattered radiation that has passed through the first region of the first polarizer assembly subsequently passes through the second region of the second polarizer assembly; and the first region of the first polarizer assembly is crossed relative to the first region of the second polarizer assembly and the second region of the first polarizer assembly is crossed relative to the second region of the second polarizer assembly.

19. A method of measuring a target formed by a lithographic process, the target comprising a layered structure having a first periodic structure in a first layer and a second periodic structure in a second layer, the method comprising:

illuminating the target with polarized measurement radiation;

detecting zeroth order scattered radiation from the target; and running a computer program product comprising machine readable instructions on a suitable processor, causing the processor to perform deriving an asymmetry in the first periodic structure using the detected zeroth order scattered radiation from the target, wherein a separation between the first layer and the second layer is such that the zeroth order scattered radiation is independent of overlay error between the first periodic structure and the second periodic structure.

20. A lithographic system comprising:

a lithographic apparatus for use in a lithographic process, and a metrology apparatus comprising an illumination system configured to illuminate a target formed by a lithographic process with polarized measurement radiation, wherein the polarized measurement radiation comprises first radiation in a first wavelength band and second radiation in a second wavelength band, the first wavelength band being different from, and non-overlapping with, the second wavelength band; and a detection system configured to:
detect zeroth order scattered radiation predominantly from scattering of the first radiation from a periodic structure in the target;
detect higher than zeroth order scattered radiation predominantly from scattering of the second radiation from the periodic structure in the target; and
for use in measuring a target formed by the lithographic process.

* * * * *